(12) United States Patent
Kim et al.

(10) Patent No.: US 12,512,301 B2
(45) Date of Patent: Dec. 30, 2025

(54) SUBSTRATE TREATING APPARATUS AND SUBSTRATE SUPPORT UNIT

(71) Applicant: SEMES CO., LTD., Cheonan-si (KR)

(72) Inventors: Je Ho Kim, Hwaseong-si (KR); Jae Hwan Cho, Suwon-si (KR); Taesuk Jung, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 174 days.

(21) Appl. No.: 17/364,994

(22) Filed: Jul. 1, 2021

(65) Prior Publication Data

US 2022/0013328 A1 Jan. 13, 2022

(30) Foreign Application Priority Data

Jul. 10, 2020 (KR) .................. 10-2020-0085278

(51) Int. Cl.
*H01J 37/32* (2006.01)
*H01L 21/683* (2006.01)

(52) U.S. Cl.
CPC .... *H01J 37/3244* (2013.01); *H01J 37/32642* (2013.01); *H01J 37/32724* (2013.01);
(Continued)

(58) Field of Classification Search
CPC ........... H01L 21/6833; H01L 21/67103; H01L 21/67109; H01L 21/67309; H01L 21/6831;
(Continued)

(56) References Cited

U.S. PATENT DOCUMENTS 5,382,311 A * 1/1995 Ishikawa .............. C23C 16/466
118/728
5,567,267 A * 10/1996 Kazama ................. H01J 37/32
118/724
(Continued)

FOREIGN PATENT DOCUMENTS

CN 102191482 9/2011
CN 105185681 12/2015
(Continued)

OTHER PUBLICATIONS

Notice of reason for rejection from the Japan Patent Office dated Aug. 2, 2022.
(Continued)

*Primary Examiner* — Gordon Baldwin
*Assistant Examiner* — Joshua Reyes

(57) ABSTRACT

The inventive concept provides a substrate treating apparatus. The substrate treating apparatus includes a process chamber configured to form a treatment space, a gas supply unit configured to supply a process gas into an interior of the process chamber, a plasma generating unit configured to generate plasma from the process gas introduced into the interior of the process chamber, and a substrate support unit provided in the treatment space and configured to support a substrate, the substrate support unit may include a first plate, and a second plate that is adjacent to the first plate, and a gap may be formed between the first plate and the second plate, and a supply pipe is configured to supply a gas into the space defined by the gap.

11 Claims, 7 Drawing Sheets

(52) U.S. Cl.
CPC .... *H01L 21/6833* (2013.01); *H01J 2237/002* (2013.01); *H01J 2237/2007* (2013.01)

(58) Field of Classification Search
CPC ......... H01L 21/68714; H01L 21/68785; H01L 21/68792; H01J 37/32082; H01J 37/32091; H01J 37/321; H01J 37/3244; H01J 37/32449; H01J 37/32642; H01J 37/32697; H01J 37/32715; H01J 37/32724; H01J 37/32853; H01J 2237/002; H01J 2237/2007; C23C 16/0227; C23C 16/0245; C23C 16/4401; C23C 16/4404; C23C 16/4409; C23C 16/45563; C23C 16/45578; C23C 16/4558; C23C 16/4586; C23C 16/45587; C23C 16/45591; C23C 16/463; C23C 16/466

See application file for complete search history.

(56) References Cited

U.S. PATENT DOCUMENTS

| | | | | |
|---|---|---|---|---|
| 6,013,155 | A * | 1/2000 | McMillin | C23C 16/507 216/68 |
| 6,254,686 | B1 | 7/2001 | Comita et al. | |
| 6,279,376 | B1 * | 8/2001 | Yamada | G01N 27/4077 73/23.32 |
| 7,033,444 | B1 * | 4/2006 | Komino | C23C 16/46 118/724 |
| 7,037,797 | B1 * | 5/2006 | Shooshtarian | H01L 21/67109 438/378 |
| 2005/0041238 | A1 * | 2/2005 | Ludviksson | H01J 37/32935 356/72 |
| 2005/0175952 | A1 * | 8/2005 | Toba | H01L 21/67109 432/241 |
| 2006/0076109 | A1 * | 4/2006 | Holland | H01L 21/67248 118/724 |
| 2007/0108160 | A1 | 5/2007 | Ngo et al. | |
| 2008/0314523 | A1 * | 12/2008 | Iizuka | H01J 37/3244 118/723 R |
| 2012/0091095 | A1 * | 4/2012 | Wang | H01J 37/32862 216/37 |
| 2012/0091108 | A1 * | 4/2012 | Lin | H01L 21/6831 219/201 |
| 2014/0237840 | A1 * | 8/2014 | Knyazik | H01J 37/32449 239/522 |
| 2015/0200077 | A1 * | 7/2015 | Fukasawa | H01J 37/3405 204/298.07 |
| 2016/0047040 | A1 * | 2/2016 | Mishra | H01J 37/3244 118/723 R |
| 2016/0181137 | A1 * | 6/2016 | Lee | C22C 49/14 118/723 R |
| 2016/0319424 | A1 * | 11/2016 | Takahashi | C23C 16/4409 |
| 2017/0352576 | A1 * | 12/2017 | Tanaka | H01L 21/67103 |
| 2017/0365444 | A1 * | 12/2017 | Kim | H01L 21/67069 |
| 2018/0258531 | A1 * | 9/2018 | Ma | C23C 16/513 |
| 2019/0027394 | A1 * | 1/2019 | Sarode Vishwanath | H01L 21/68757 |
| 2019/0341264 | A1 * | 11/2019 | Ow | H01L 21/3003 |

FOREIGN PATENT DOCUMENTS

| | | |
|---|---|---|
| CN | 105047527 | 8/2018 |
| EP | 1300877 | 4/2003 |
| JP | 06-196443 | 7/1994 |
| JP | 07-130828 | 5/1995 |
| JP | 09-097830 | 4/1997 |
| JP | 2001068538 | 3/2001 |
| JP | 2002-217178 | 8/2002 |
| JP | 2004087869 | 3/2004 |
| JP | 3881908 | 11/2006 |
| JP | 2007-142374 | 6/2007 |
| JP | 2020017697 | 1/2020 |
| KR | 1020020022072 | 3/2002 |
| KR | 1020150090844 | 8/2015 |
| KR | 1020160065382 | 10/2016 |
| KR | 20160134908 | 11/2016 |
| KR | 10-2070867 | 6/2017 |
| KR | 1020170060934 | 6/2017 |
| KR | 10-2019-0118130 | 10/2019 |
| TW | I566292 | 1/2017 |
| TW | 201939607 | 10/2019 |
| TW | 201945673 | 12/2019 |
| TW | I692807 | 5/2020 |
| WO | 2017056244 | 4/2017 |
| WO | 2017221631 | 12/2017 |

OTHER PUBLICATIONS

Office Action dated Jun. 21, 2022 from the Taiwan Patent Office.
Office Action of the China National Intellectual Property Administration dated Oct. 31, 2023.
Office Action from the Korean Intellectual Property Office dated Apr. 28, 2024.

* cited by examiner

SUBSTRATE TREATING APPARATUS AND SUBSTRATE SUPPORT UNIT

CROSS-REFERENCE TO RELATED APPLICATIONS

A claim for priority under 35 U.S.C. § 119 is made to Korean Patent Application No. 10-2020-0085278 filed on Jul. 10, 2020, in the Korean Intellectual Property Office, the entire contents of which are hereby incorporated by reference.

BACKGROUND

Embodiments of the inventive concept described herein relate to a substrate treating apparatus and a unit for supporting a substrate in the substrate treating apparatus.

In a treatment apparatus that treats a substrate by using plasma through a specific process, the substrate is controlled to a specific temperature. It is necessary to cool a semiconductor wafer to maintain the temperature of a semiconductor wafer in a process using plasma because the substrate is heated by the plasma. For example, a substrate supported by a substrate support unit is cooled by circulating a coolant of a temperature that is lower than a room temperature in the substrate support unit.

However, because the temperature of the substrate support unit becomes lower than the room temperature due to the coolant that circulates in the interior of the substrate support unit, components in a part that contacts exterior air may be dew-condensed. If the components of the treatment system are dew-condensed, there occur severe problems in operations of the facility, such as a breakdown of an electric component, due to the moisture generated due to dew-condensation.

An extremely low temperature plasma apparatus that performs plasma treatment in an extremely low temperature environment of −30° C. or less is particularly vulnerable to dew-condensation.

SUMMARY

Embodiments of the inventive concept provide a substrate treating apparatus that may effectively prevent dew-condensation of components of a substrate support unit, which are exposed to the atmosphere, and a substrate support unit.

Embodiments of the inventive concept also provide a substrate treating apparatus that may prevent dew-condensation of components of a substrate support unit, which are exposed to the atmosphere, with a relatively simple configuration, and a substrate support unit.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a process chamber which forms a treatment space, a gas supply unit which supplies a process gas into an interior of the process chamber, a plasma generating unit which generates plasma from the process gas introduced into the interior of the process chamber, and a substrate support unit provided in the treatment space and supporting a substrate, the substrate support unit may include a first plate, and a second plate that is adjacent to the first plate, and a gap may be formed between the first plate and the second plate, and a supply pipe is configured to supply a gas into the space defined by the gap.

In an embodiment, the first plate may include a dielectric plate embedding an electrostatic electrode that suctions the supported substrate with an electrostatic force, and an electrode plate provided under the dielectric plate and receiving electric power for generating the plasma, and the second plate may be an insulator plate provided under the first plate.

In an embodiment, the substrate support unit may further include a dielectric plate embedding an electrostatic electrode which suctions the supported substrate with an electrostatic force, and an electrode plate provided under the dielectric plate and receiving electric power for generating the plasma, the first plate may be an insulator plate provided under the electrode plate, and the second plate may be a base plate provided under the insulator plate.

In an embodiment, a gap may be formed between the electrode plate and the insulator plate, and the supply pipe may supply the gas to any one or more of the gap between the electrode plate and the insulator plate and a gap between the insulator plate and the base plate.

In an embodiment, a partial area of a side surface that forms the supply pipe may be configured to be exposed to the gap between the insulator plate and the base plate, and one or more distribution holes are formed in the partial area.

In an embodiment, the gap may be defined by a step formed in the insulator plate.

In an embodiment, the gap may be defined by a groove formed in any one or more of the first plate or the second plate.

In an embodiment, a maximum diameter of the groove may be the same as or larger than a diameter of a wafer when the groove is viewed from a top.

In an embodiment, the gas may be dry air or an inert gas.

In an embodiment, the substrate treating apparatus may treat the substrate by using extremely low temperature plasma.

The inventive concept provides a substrate support unit for supporting a substrate. The substrate support unit includes an upper plate, and a lower plate provided under the upper plate, a gap may be formed between the upper plate and the lower plate, and the substrate support unit may further include a supply pipe which supplies a gas into a space formed by the gap while passing through the lower plate.

In an embodiment, the plate include a dielectric plate embedding an electrostatic electrode which suctions the supported substrate with an electrostatic force, and an electrode plate provided under the dielectric plate and receiving electric power for generating the plasma, and the lower plate may be an insulator plate.

In an embodiment, the substrate support unit may further include a dielectric plate embedding an electrostatic electrode which suctions the supported substrate with an electrostatic force, and an electrode plate provided under the dielectric plate and receiving electric power for generating the plasma, the upper plate may be an insulator plate provided under the electrode plate, and the lower plate may be a base plate.

In an embodiment, a gap may be formed between the electrode plate and the insulator plate, and the supply pipe may supply the gas to any one or more of the gap between the electrode plate and the insulator plate and a gap between the insulator plate and the base plate.

In an embodiment, the supply pipe may have one or more distribution holes on a side surface, which is exposed to the gap between the insulator plate and the base plate.

In an embodiment, the gap may be defined by a groove formed in the insulator plate.

In an embodiment, the gap may be defined by a groove formed on any one or more of a lower surface of the upper plate and an upper surface of the lower plate.

In an embodiment, the electrode plate may have a passage, through which a coolant flows.

A substrate treating apparatus according to another aspect of the inventive concept treats a substrate by using plasma, and includes a process chamber which forms a treatment space, a gas supply unit which supplies a process gas into an interior of the process chamber, a plasma generating unit which generates plasma from the process gas introduced into the interior of the process chamber, and a substrate support unit provided in the treatment space and supporting the substrate, the substrate support unit includes a dielectric plate embedding an electrostatic electrode which suctions the substrate, an electrode plate provided under the dielectric plate and having a passage, through which a coolant flows, in the interior thereof, an annular focus ring provided at a circumference of the dielectric plate, an insulator plate provided under the electrode plate and formed of an insulator, and a base plate provided under the insulator plate and grounded, a gap is formed at any one or more of locations between the electrode plate and the insulator plate and between the insulator plate and the base plate, and the gap includes a supply pipe which supplies dry air or an inert gas.

In an embodiment, the gap may include a first gap formed between the electrode plate and the insulator plate, and a second gap formed between the insulator plate and the base plate, an upper end of the supply pipe is located in the first gap, and a partial area of a side surface, which forms the supply pipe, is exposed to the second gap, and one or more distribution holes are formed in the partial area of the side surface of the supply pipe.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The above and other aspects, features and advantages of the inventive concept will become apparent from the following description of the following embodiments given in conjunction with the accompanying drawings. However, the inventive concept is not limited to the embodiments disclosed below, but may be implemented in various forms. The embodiments of the inventive concept are provided to make the disclosure of the inventive concept complete and fully inform those skilled in the art to which the inventive concept pertains of the scope of the inventive concept.

Although not defined, all the terms (including technical or scientific terms) used herein may have the same meanings that are generally accepted by the common technologies in the field to which the inventive concept pertains. The terms defined by the general dictionaries may be construed to have the same meanings as those meant in the related technologies and the disclosure of the application, and will neither become conceptual nor be construed to be excessively formal even though not clearly defined herein. The terms used herein are provided to describe the embodiments but not to limit the inventive concept. In the specification, the singular forms include plural forms unless particularly mentioned. The expressions 'include' and its various conjugated forms, such as 'including', which are used in the specification do not exclude existence or addition of one or more compositions, substances, elements, steps, operations, and devices.

Hereinafter, embodiments of the inventive concept will be described in detail with reference to the accompanying drawings.

Figure 1:
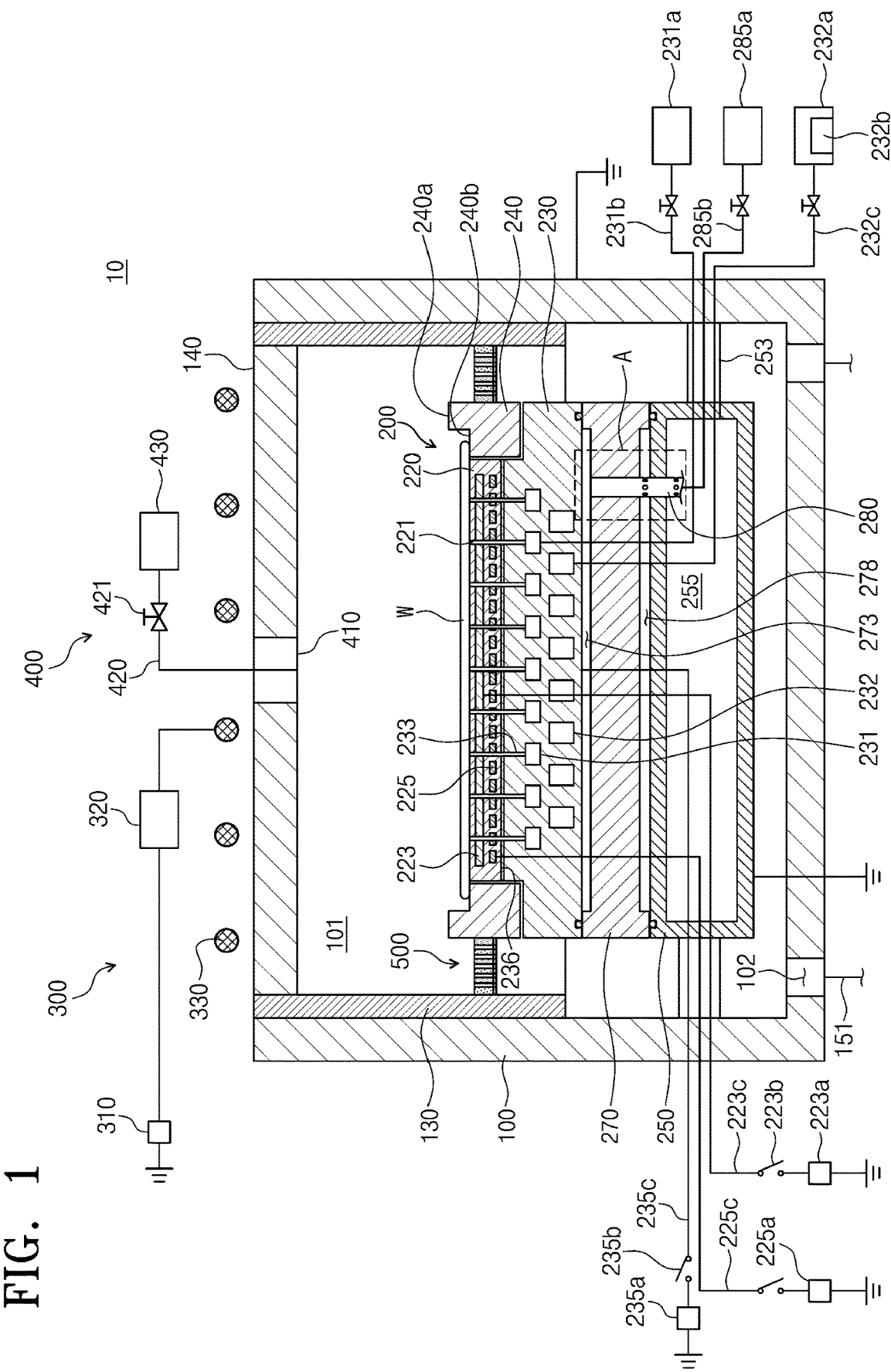
FIG. 1 is a view illustrating a substrate treating apparatus according to an embodiment of the inventive concept.

FIG. 1 is an exemplary view illustrating a substrate treating apparatus 10 according to an embodiment of the inventive concept. The substrate treating apparatus 10 according to the illustrated embodiment is a plasma treating apparatus (an inductively coupled plasma treating apparatus). The substrate treating apparatus 10 treats a wafer W by using plasma. A semiconductor wafer (hereinafter, simply referred to as 'a wafer W') is provided as an example of a substrate. For example, the substrate treating apparatus 10 may perform an etching process on the wafer W. The substrate treating apparatus 10 may include a process chamber 100 (i.e., a chamber), a substrate support unit 200, a plasma generating unit 300, a gas supply unit 400, a baffle unit 500, and a controller (not illustrated).

The process chamber 100 provides a treatment space 101, in which a substrate treating process is performed, in the interior thereof. The treatment space 101 may be maintained at a process pressure of a pressure that is lower than the atmospheric pressure, and may be a closed space. The process chamber 100 may be formed of a metallic material. As an example, the process chamber 100 may be formed of aluminum. A surface of the process chamber 100 may be anodized. The process chamber 100 may be electrically grounded. An exhaust hole 102 may be formed on a bottom surface of the process chamber 100. The exhaust hole 102 may be connected to an exhaust line 151. Reaction side-products generated in the process and gases that stay in the interior space of the chamber may be discharged to the outside through the exhaust line 151. The pressure of the interior of the process chamber 100 may be reduced to a specific pressure through an exhaustion process.

According to an embodiment, a liner 130 may be provided in the interior of the process chamber 100. The liner 130 may have a cylindrical shape, an upper surface and a lower surface of which are opened. The liner 130 may be configured to contact an inner surface of the chamber 100. The liner 130 may prevent an inner wall of the chamber 100 from being damaged due to arc discharging, by protecting the inner wall of the chamber 100. Furthermore, the liner 130 may prevent impurities generated during the substrate treating process from being deposited on the inner wall of the chamber 100. The liner 130 may be exposed to the treatment space in the interior of the process chamber 100 to react a first cleaning gas, and may include Yttria ($Y_2O_3$).

A window 140 is provided at an upper portion of the process chamber 100. The window 140 has a plate shape. The window 140 seals the treatment space 101 by covering an opened upper surface of the process chamber 100. The window 140 may include a dielectric sub stance.

The substrate support unit 200 is provided in the interior of the process chamber 100. In an embodiment, the substrate support unit 200 may be located in the interior of the chamber 100 to be spaced apart upwards from a bottom surface of the chamber 100 by a specific distance. The substrate support unit 200 may support the wafer W. The substrate support unit 200 may include an electrostatic chuck ESC including an electrostatic electrode 223 that suctions the wafer W by using an electrostatic force. Unlike this, the substrate support unit 200 may support the wafer W in various methods such as mechanical clamping. Hereinafter, the substrate support unit 200 including the electrostatic chuck ESC will be described as an example.

The substrate support unit 200 may include a dielectric plate 220, an electrode plate 230, a base plate 250, an insulator plate 270, and a supply pipe 280.

The dielectric plate 220 and the electrode plate 230 may constitute an electrostatic chuck (ESC). The dielectric plate 220 may support the wafer W. A circumference of the dielectric plate 220 may be surrounded by a focus ring 240. The dielectric plate 220 may be located at an upper end of the electrode plate 230. The dielectric plate 220 may be formed of a dielectric substance and may have a disk shape. The wafer W may be positioned on an upper surface of the dielectric plate 220. The upper surface of the dielectric plate 220 may have a radius that is smaller than that of the wafer W. Accordingly, an edge area of the wafer W may be located on an outer side of the dielectric plate 220. An edge of the wafer W may be positioned on an upper surface of the focus ring 240.

The electrostatic electrode 223, a heater 225, and a first supply passage 221 may be included in the interior of the dielectric plate 220. The first supply passage 221 may extend pass through a bottom surface of the dielectric plate 220 from the upper surface of the dielectric plate 220. A plurality of first supply passages 221 are formed to be spaced apart from each other, and may be as passages, through which a heat transfer medium is supplied to the bottom surface of the wafer W.

The electrostatic electrode 223 may be electrically connected to a first power source 223a. The first power source 223a may include a DC power source. A switch 223b may be installed between the electrostatic electrode 223 and the first power source 223a. The electrostatic electrode 223 may be electrically connected to or disconnected from the first power source 223a through switching-on/off of the switch 223b. When the switch 223b is switched on, a DC current may be applied to the electrostatic electrode 223. An electrostatic force may be applied between the electrostatic electrode 223 and the wafer W by a current applied to the electrostatic electrode 223, and the wafer W may be suctioned to the dielectric plate 220 by the electrostatic force.

The heater 225 may be located under the electrostatic electrode 223. The heater 225 may be electrically connected to a second power source 225a. The heater 225 may generate heat while resisting against a current applied to the second power source 225a. The generated heat may be transferred to the wafer W through the dielectric plate 220. The wafer W may be maintained at a specific temperature by the heat generated by the heater 225. The heater 225 may include a spiral coil.

The electrode plate 230 may be located at a lower portion of the dielectric plate 220. A bottom surface of the dielectric plate 220 and an upper surface of the electrode plate 230 may be bonded to each other by an adhesive 236. The electrode plate 230 may be formed of aluminum. An upper surface of the electrode plate 230 may be stepped such that a central area thereof is higher than an edge area thereof. The central area of the upper surface of the electrode plate 230 may have an extent corresponding to a bottom surface of the dielectric plate 220, and may be bonded to the bottom surface of the dielectric plate 220. The electrode plate 230 may have first circulation passages 231, second circulation passages 232, and second supply passages 233 in the interior thereof.

The first circulation passages 231 may be provided as passages, through which the heat transfer medium circulates. The first circulation passages 231 may be formed in the interior of the electrode plate 230 to have a spiral shape. Furthermore, the first circulation passages 231 may be disposed such that passages having ring shapes of different radii have the same center. The first circulation passages 231 may communicate with each other. The first circulation passages 231 may be formed at the same height.

The second circulation passages 232 may be provided as passages, through which a coolant circulates. The second circulation passages 232 may be formed in the interior of the electrode plate 230 to have a spiral shape. Furthermore, the second circulation passages 232 may be disposed such that passages having ring shapes of different radii have the same center. The second circulation passages 232 may communicate with each other. The second circulation passages 232 may have a cross-sectional area that is larger than that of the first circulation passages 231. The second circulation passages 232 may be formed at the same height. The second circulation passages 232 may be formed under the first circulation passages 231.

The second supply passages 233 may extend upwards from the first circulation passages 231, and may be provided on an upper surface of the electrode plate 230. The number of the second supply passages 233 corresponds to the number of the first supply passages 221, and may connect the first circulation passages 231 to the first supply passages 221.

The first circulation passages 231 may be connected to a heat transfer medium storage 231a through heat transfer medium supply lines 231b. A heat transfer medium may be stored in the heat transfer medium storage 231a. The heat transfer medium may include an inert gas. According to an embodiment, the heat transfer medium may include a helium (He) gas. The helium gas may be supplied to the first circulation passages 231 through the heat transfer medium supply lines 231b, and may be supplied to a bottom surface of the wafer W after sequentially passing through the second supply passages 233 and the first supply passages 221. The helium gas may function as a medium, by which the heat transferred from plasma to the wafer W is transferred to the dielectric plate 220.

The second circulation passages 232 may be connected to a coolant storage 232a through coolant supply lines 232c. The coolant storage 232a may store the coolant. A cooler 232b may be provided in the coolant storage 232a. The cooler 232b may cool the coolant to a specific temperature. Unlike this, the cooler 232b may be installed on the coolant supply lines 232c. The coolant supplied to the second circulation passages 232 through the coolant supply lines 232c may cool the electrode plate 230 while circulating along the second circulation passages 232. The electrode plate 230 may cool the dielectric plate 220 and the wafer W together while being cooled to maintain the wafer W at a specific temperature. In an embodiment, the coolant may be cooled to 0° C. (a low temperature) or less to be supplied. In a preferred embodiment, the coolant may be cooled to −30° C. or less (an extremely low temperature) to be supplied. In an embodiment, the coolant cools the electrode plate 230 to an extremely low temperature of −30° C. to −100° C., more preferably, −30° C. to −60° C.

The electrode plate 230 may include a metal plate. According to an embodiment, the whole electrode plate 230 may be formed of a metal plate. The electrode plate 230 may be electrically connected to a third power source 235a. The third power source 235a may be provided as a high-frequency power source that generates high-frequency electric power. The high-frequency power source may include an RF power source. The electrode plate 230 may receive high-frequency electric power from the third power source 235a. Accordingly, the electrode plate 230 may function as an electrode, that is, a lower electrode.

The focus ring 240 may be disposed at an edge area of the dielectric plate 220. The focus ring 240 may have a ring shape, and may be disposed along a circumference of the dielectric plate 220. An upper surface of the focus ring 240 may be stepped such that an outer side 240a thereof is higher than an inner side 240b thereof. The inner side 240b of the upper surface of the focus ring 240 may be located at the same height as that of the upper surface of the dielectric plate 220. The inner side 240b of the upper surface of the focus ring 240 may support an edge area of the wafer W located on an outside of the dielectric plate 220. The outer side 240a of the focus ring 240 may be provided to surround an edge area of the wafer W. The focus ring 240 may control an electromagnetic field such that densities of plasma are uniformly distributed in the whole area of the wafer W. Accordingly, plasma is uniformly formed over the whole area of the wafer W such that the areas of the wafer W may be uniformly etched.

The base plate 250 may be located at a lower end of the substrate support unit 200. The base plate 250 may be spaced upwards apart from the bottom surface of the chamber 100. A space 255 (i.e., an interior space) may be formed in an interior of the base plate 250. Although not illustrated, according to an embodiment, a lower portion of the base plate 250 may be opened. Furthermore, although not illustrated, according to an embodiment, an upper portion of the base plate 250 may be opened. The space 255 formed by the base plate 250 may fluid-communicate with the outside of the space 255. The outer radius of the base plate 250 may have the same as the outer radius of the electrode plate 230. A lift pin module (not illustrated) that moves the transferred wafer W from a transfer member on the outside to the dielectric plate 220 may be located in the interior space 255 of the base plate 250. The lift pin module (not illustrated) may be spaced apart from the base plate 250 by a specific interval. The base plate 250 may be formed of a metallic material. The interior space 255 of the base plate 250 may be provided with air. Because the dielectric constant of air is lower than that of an insulator, the air may reduce an electromagnetic field in the interior of the substrate support unit 200.

The insulator plate 270 may be located between the dielectric plate 220 and the base plate 250. The insulator plate 270 may cover an upper surface of the base plate 250. The insulator plate 270 may have a cross-sectional area corresponding to the electrode plate 230. The insulator plate 270 may include an insulator. The insulator plate 270 may function to increase an electrical distance between the electrode plate 230 and the base plate 250. An upper surface of the insulator plate 270 may have a step formed as an edge thereof protrudes upwards. The upper surface of the insulator plate 270 may have a recess (e.g., groove formed by the step). A lower surface of the insulator plate 270 may have a step formed as an edge thereof protrudes downwards. The lower surface of the insulator plate 270 may have a recess (e.g., a groove formed by the step). A first gap 273 between the insulator plate 270 and the electrode plate 230 is defined by the groove formed on the upper surface of the insulator plate 270. A second gap 278 between the insulator plate 270 and the base plate 250 is defined by the groove formed on the lower surface of the insulator plate 270.

The supply pipe 280 supplies a low-humidity gas, the humidity of which is lower than that of air outside the substrate treating apparatus 10, to the first gap 273, the second gap 278, and the interior space 255. In an embodiment, the low humidity gas is dry air that is air obtained after moisture is removed in advance by a facility or a bombe of a factory, dry air obtained by removing moisture from air supplied into a room (for example, a clean room), in which the substrate treating apparatus 10 is installed, or gas having a low content of moisture, and may be oxygen, nitrogen, or an inert gas such as a noble gas.

A cross-section of the supply pipe 280 may be circular, and the supply pipe 280 may be cylindrical. The supply pipe 280 may be configured to pass through the base plate 250 and the insulator plate 270. The supply pipe 280 is provided at a location that deviates from the center of the substrate support unit 200 by a distance, when the substrate support unit 200 is viewed from the top. In an embodiment, when the substrate support unit 200 is viewed from the top, a rod (not illustrated) that supplies electric power to the electrode plate 230 may be disposed at the center of the substrate support unit 200, and the supply pipe 280 may be provided at a location that avoids the location of the rod (not illustrated). The supply pipe 280 may be formed of engineering plastic. An upper end of the supply pipe 280 is located to be exposed to the first gap 273. The supply pipe 280 is connected to low humidity gas storage 285a by a low humidity gas supply line 285b. The low humidity gas storage 285a may be a drier that generates dry air by removing moisture from air of a clean room. Furthermore, the low humidity gas storage 285a may be a gas cylinder, in which the low humidity gas is stored. The low humidity gas storage 285a may be provided outside the chamber 100. A flow meter (not illustrated) and a regulator (not illustrated) may be installed in the low humidity gas supply line 285b to constantly maintain the pressure and the flow rate of the supplied low humidity gas.

Figure 2:
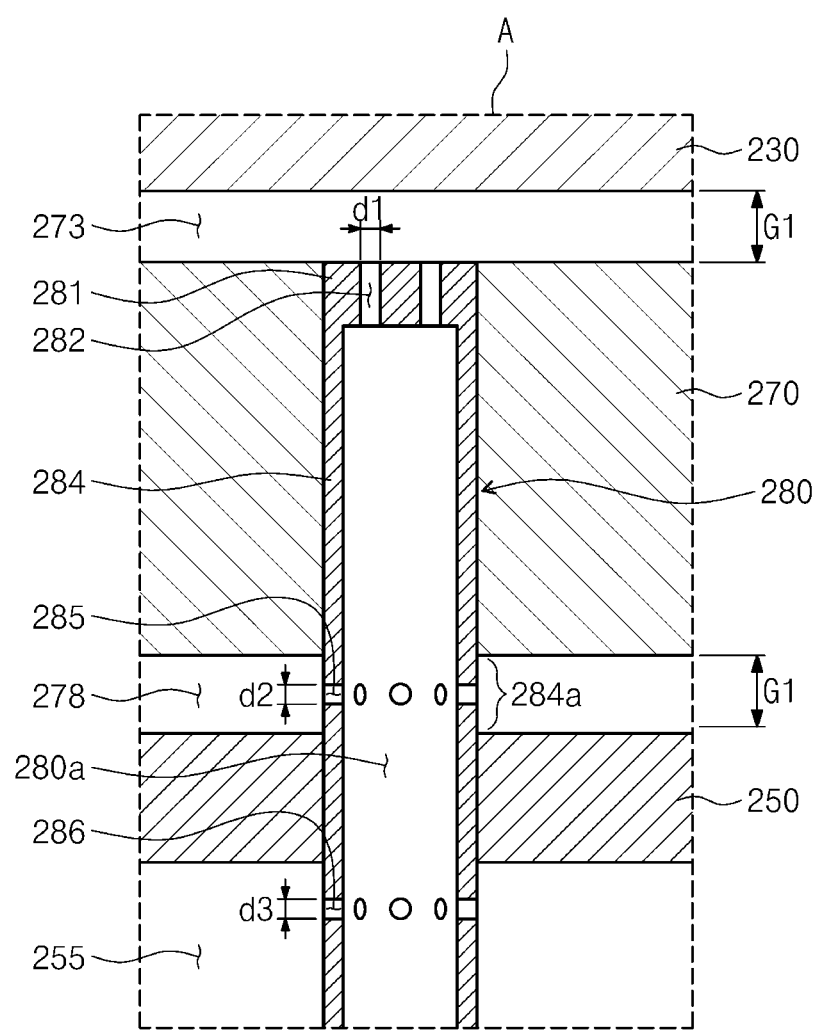
FIG. 2 is an enlarged cross-sectional view of portion "A" of FIG. 1.

FIG. 2 is an enlarged cross-sectional view of portion "A" of FIG. 1. A low humidity gas supply structure using the supply pipe 280 will be described in more detail with reference to FIG. 2. An upper end 281 of the supply pipe 280 is located to be exposed to the first gap 273. A partial area 284a of a side surface 284 of the supply pipe 280 is exposed to the second gap 278. One or more first distribution holes 282 are formed in the upper end 281 of the supply pipe 280. One or more second distribution holes 285 are formed in the partial area 284a of the side surface 284 of the supply pipe 280, which is exposed to the second gap 278. One or more third distribution holes 286 are formed in an area of the side surface 284 of the supply pipe 280, which is exposed to the interior space 255.

An interval G1 of the first gap 273 defined by the groove formed on the upper surface of the insulator plate 270 may be 0.3 mm to 0.7 mm. An interval G1 of the second gap 278 defined by the groove formed on the lower surface of the insulator plate 270 may be 0.3 mm to 0.7 mm. The suggested numerical ranges of the first gap 273 and the second gap 278 are disclosed only to make the inventive concept clear and are not intended to limit the scope of the inventive concept through the description of the inventive concept.

A diameter $d_1$ of the first distribution holes 282 formed in the supply pipe 280, a diameter $d_2$ of the second distribution holes 285, and a diameter $d_3$ of the third distribution holes 286 may be 0.1 mm to 0.5 mm. The suggested numerical ranges of the diameter $d_1$ of the first distribution holes 282, the diameter $d_2$ of the second distribution holes 285, and the diameter $d_3$ of the third distribution holes 286 are disclosed only to make the inventive concept clear, and are not intended to limit the scope of the inventive concept through the description of the inventive concept. The diameter $d_1$ of the first distribution holes 282, the diameter $d_2$ of the second distribution holes 285, and the diameter $d_3$ of the third distribution holes 286 may be appropriately adjusted according to designs to control the injection speed and the injection amount of the low humidity gas.

The existing gas that is present in the first gap 273, the second gap 278, and the interior space 255 may be replaced by the low humidity gas distributed to the first gap 273, the second gap 278, and the interior space 255 by the supply pipe 280. The low humidity gas has a low dew point, dew-condensation that may occur in the first gap 273, the second gap 278, and the interior space 255 is prevented. It is preferable that the amount of the supplied low humidity gas is minimized in a range, by which dew-condensation is prevented in the first gap 273, the second gap 278, and the interior space 255. In the substrate support unit 200, dew-condensation is prevented while the air in the first gap 273, the second gap 278, and the interior space 255 is continuously replaced by the low humidity gas, which is controlled to a specific pressure and is supplied.

Figure 3:
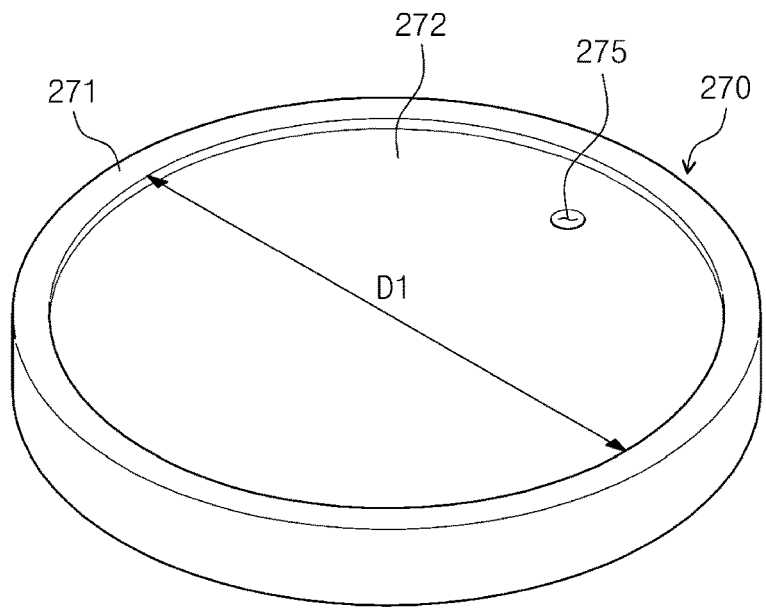
FIG. 3 is a view illustrating a perspective view of an insulator plate according to an embodiment, viewed from the top.
Figure 4:
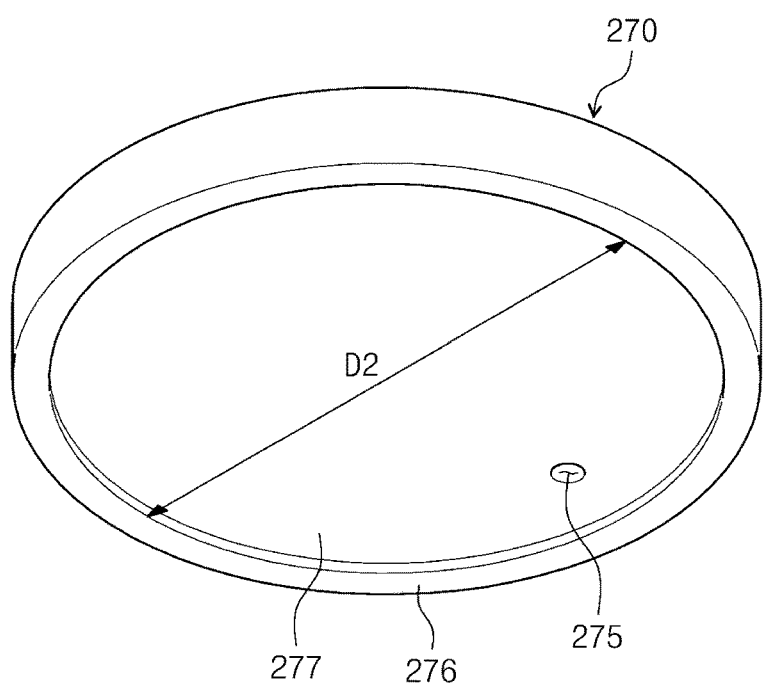
FIG. 4 is a view illustrating a perspective view of an insulator plate according to an embodiment, viewed from the bottom.

FIG. 3 is a view illustrating a perspective view of an insulator plate according to an embodiment, viewed from the top. FIG. 4 is a view illustrating a perspective view of an insulator plate according to an embodiment, viewed from the bottom. The step defining the first gap 273 and the step defining the second gap 278 will be described in more detail with reference to FIGS. 3 and 4.

An upper surface of the insulator plate 270 has a step formed as an edge 271 thereof protrudes. An inner surface 272 of the insulator plate 270 forms a recess (e.g., a groove due to the protrusion of the edge of the upper surface of the insulator plate 270). For convenience of description, it is illustrated that the edge of the groove is circular, but the shape of the edge of the groove may be restricted for the reasons of design, such as restrictions on coupling relationships with other components, or the location of the groove in relationship with the other components. However, it is preferable that the depth of the whole groove is uniform. A hole 275, through which the supply pipe 280 passes, is formed in the insulator plate 270. Substantially, holes, through which a first power source line 223c, a second power source line 225c, a third power source line 235c, a heat transfer medium supply line 231b, and a coolant supply line 232c pass, are formed in the insulator plate 270, but illustration thereof will be omitted.

A lower surface of the insulator plate 270 has a step formed as an edge 276 thereof protrudes. An inner surface 277 of the insulator plate 270 forms a recess (e.g., a groove due to the protrusion of the edge of the lower surface of the insulator plate 270). For convenience of description, it is illustrated that the edge of the groove is circular, but the shape of the edge of the groove may be restricted for the reasons of design, such as restrictions on coupling relationships with other components, or the location of the groove in relationship with the other components.

The maximum diameter D1 of the edge of the groove formed on the upper surface of the insulator plate 270 may be the same as or larger than the diameter of the supported wafer W. As an area obtained by projecting the first gap 273 upwards and downwards corresponds to the wafer W, a higher insulation effect may be obtained by a gas layer filled in the gap. The maximum diameter D2 of the edge of the groove formed on the lower surface of the insulator plate 270 may be the same as or larger than the diameter of the supported wafer W.

Referring to FIG. 1 again, the base plate 250 may have a connecting member 253. The connecting member 253 may connect an outer surface of the base plate 250 to an inner wall of the chamber 100. A plurality of connecting members 253 may be provided on an outer surface of the base plate 250 at a specific interval. The connecting member 253 may support the substrate support unit 200 in the interior of the chamber 100. Further, the base plate 250 may be connected to the inner wall of the chamber 100 to be electrically grounded. The first power source line 223c connected to the first power source 223a, the second power source line 225c connected to the second power source 225a, the third power source lines 236c, 237c, and 238c connected to the third power source 235a, the heat transfer medium supply line 231b connected to the heat transfer medium storage 231a, the coolant supply line 232c connected to the coolant storage 232a, the low humidity gas supply line 285b connected to the low humidity gas storage 285a, and the like may extend into the base plate 250 through the interior space 255 of the connecting member 253.

The plasma generating unit 300 may excite a process gas in the chamber 100 into a plasma state. The plasma generating unit 300 may use a plasma source of an inductively coupled plasma (ICP) type. When the plasma source of the ICP type is used, an antenna 330 provided at an upper portion of the chamber 100, and the electrode plate 230 provided as a lower electrode provided in the chamber 100 may be included. The antenna 330 and the electrode plate 230 may be vertically arranged in parallel to each other while the treatment space 101 being interposed therebetween. The antenna 330 as well as the electrode plate 230 may receive RF signals from an RF power source 310 and may receive energy for generating plasma. An electromagnetic field may be formed in a space between the two electrodes, and the process gas supplied into the space may be excited into a plasma state. A substrate treating process is performed by using the plasma. The RF signals applied to the antenna 330 and the electrode plate 230 may be controlled by a controller (not illustrated). According to the embodiment of the inventive concept, a waveguide 320 may be arranged above the antenna 330, and the waveguide 320 delivers an RF signal provided from the RF power source 310 to the antenna 330. The waveguide 320 may have a conductor that may be inserted into the waveguide. The plasma generated by the plasma generating unit 300 treats the wafer W cooled to an extremely low temperature (−30° C. or less). The process of treating the wafer W into plasma in the extremely low temperature environment is referred to as an extremely low temperature plasma process.

The gas supply unit 400 may supply a process gas into the interior of the chamber 100. The gas supply unit 400 may include a gas supply nozzle 410, a gas supply line 420, and gas storage 430. The gas supply nozzle 410 may be installed at a central portion of the window 140 corresponding to the upper surface of the chamber 100. An ejection hole may be formed on the bottom surface of the gas supply nozzle 410. A process gas may be supplied into the interior of the chamber 100 through the ejection hole. The gas supply line 420 may connect the gas supply nozzle 410 to the gas storage 430. The gas supply line 420 may supply the process gas stored in the gas storage 430 to the gas supply nozzle 410. A valve 421 may be installed in the gas supply line 420. The valve 421 may open and close the gas supply line 420, and may adjust a flow rate of the process gas supplied through the gas supply line 420.

The process gas supplied by the gas supply unit 400 may be any one or more of methane ($CF_4$), hydrogen ($H_2$), hydrogen bromide (HBr), nitrogen trifluoride ($NF_3$), difluoromethane ($CH_2F_2$), oxygen ($O_2$), fluorine ($F_2$), and hydrogen fluoride (HF), or a combination thereof. Meanwhile, the suggested process gas may be selected differently according to a necessity in spite of the embodiment. The process gas according to the embodiment of the inventive concept etches the substrate after being excited into a plasma state.

The baffle unit 500 may be located between the inner wall of the chamber 100 and the substrate support unit 200. A baffle 510 may have a ring shape. The baffle 510 may have a plurality of through-holes 511. The process gas provided into the process chamber 100 may pass through through-holes 511 of the baffle 510 to be exhausted through the exhaust hole 102. The flow of the process gas may be controlled according to the shape of the baffle 510 and the shape of the through-holes 511.

The controller (not illustrated) may control overall operations of the substrate treating apparatus 10. The controller (not illustrated) may include a central processing unit (CPU), a read only memory (ROM), and a random access memory (RAM). The CPU executes desired processing, such as etching, which will be described below, according to various recipes stored in the memory areas. Control information of the apparatus on a process condition, such as a process time, a process pressure, a high-frequency power or voltage, various flow rate of gases, the temperatures in the chamber (the temperatures of the electrodes, a temperature of the side wall of the chamber, and the temperature of the electrostatic chuck), and the temperature of the cooler 232b, is input as the recipes. Meanwhile, the recipes that represent the program or the treatment conditions may be stored in a hard disk or a semiconductor memory. Furthermore, the recipes may be set at a specific location of a memory area while being accommodated in a non-transitory computer readable storage medium, such as a CD-ROM or a DVD.

Figure 5:
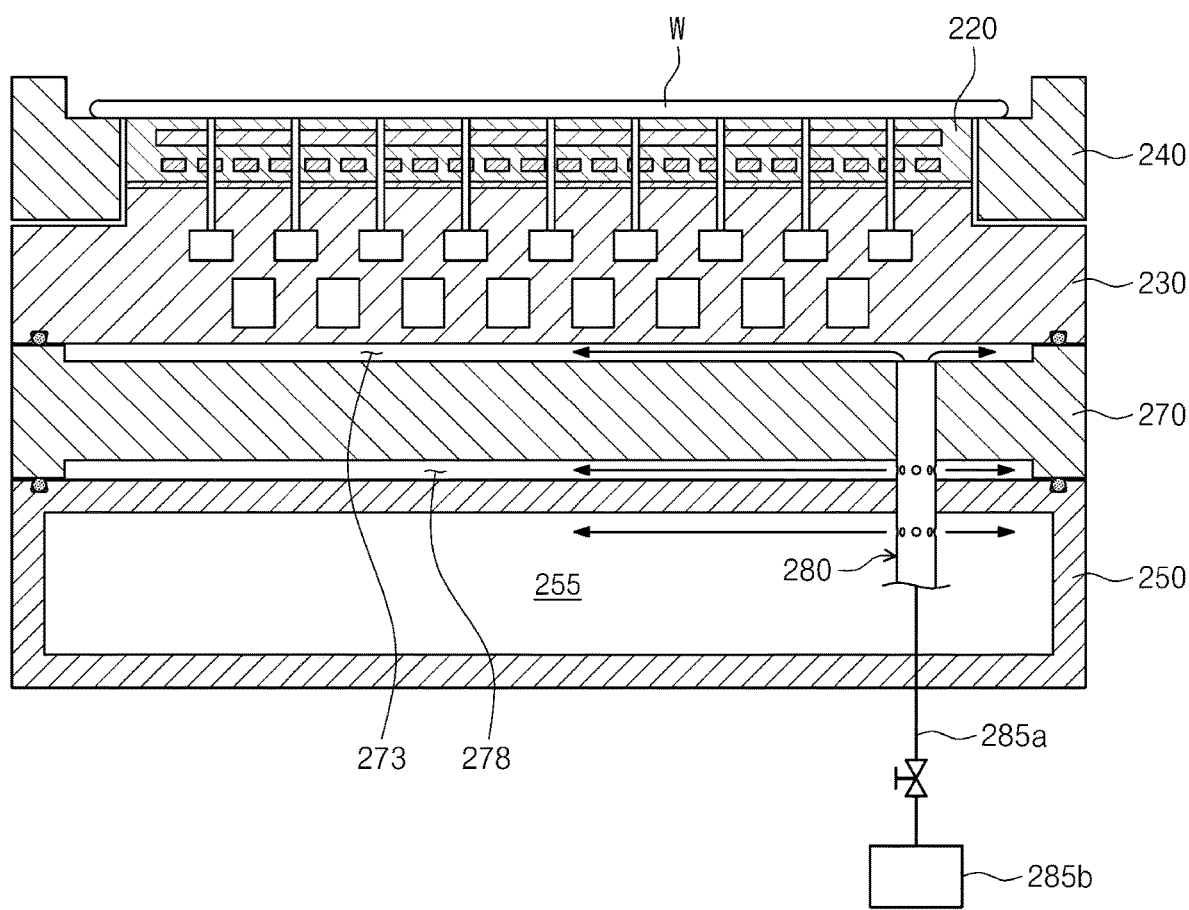
FIG. 5 is a view illustrating a state, in which a low humidity gas is supplied to a gap, in a cross-sectional view of a substrate support unit according to a first embodiment.

FIG. 5 is a view illustrating a state, in which a low humidity gas is supplied to a gap, in a cross-sectional view of a substrate support unit according to a first embodiment. The substrate support unit according to the first embodiment illustrated with reference to FIG. 5 is the same as the embodiment illustrated with reference to FIGS. 1 to 4. The supply pipe 280 supplies the low humidity gas into the first gap 273, the second gap 278, and the interior space 255 at the same time. The gas filled already is continuously replaced by the low humidity gas that is supplied. The gas filled already is discharged to the outside of the substrate support unit by a gap inevitably formed when the components are assembled. Accordingly, dew-condensation caused between the components of the substrate support unit may be prevented.

Figure 6:
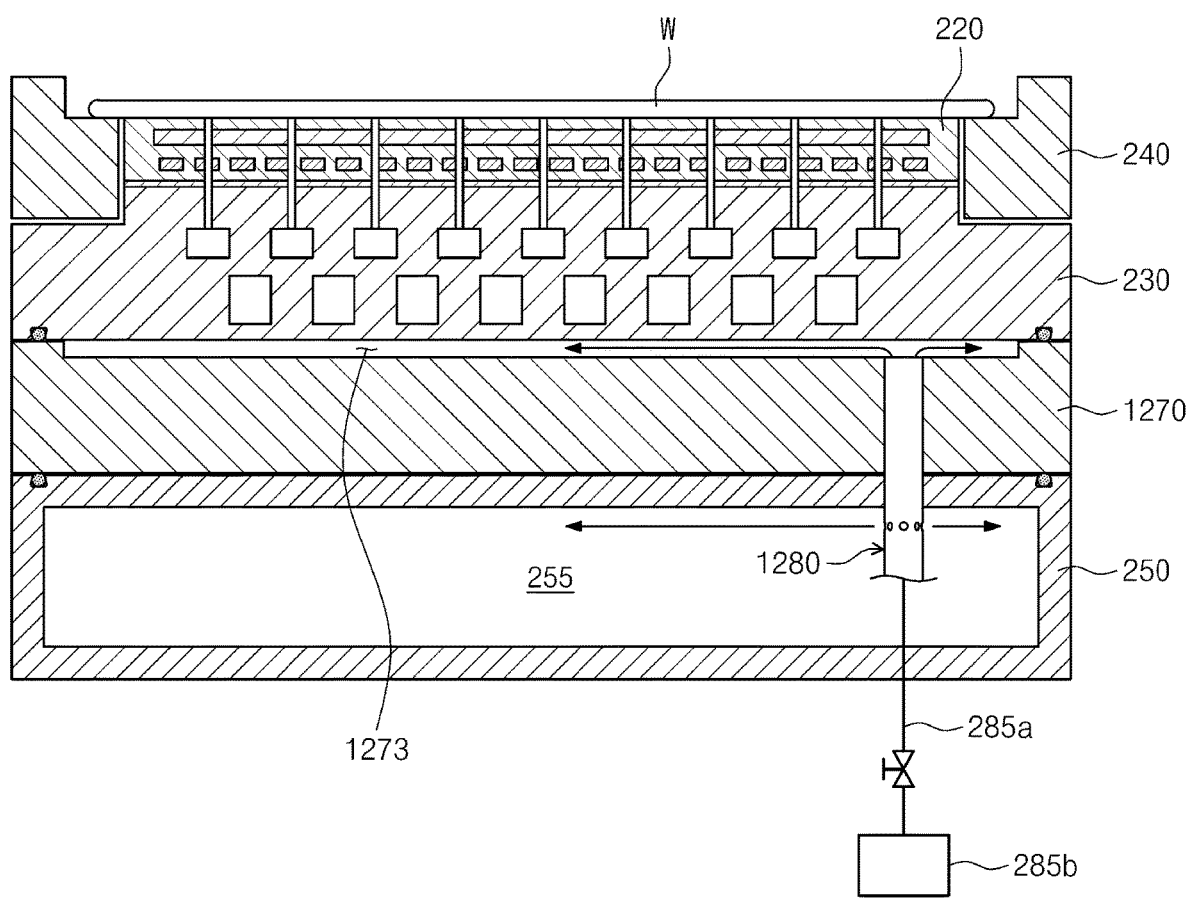
FIG. 6 is a view illustrating a state, in which a low humidity gas is supplied to a gap, in a cross-sectional view of a substrate support unit according to a second embodiment.

FIG. 6 is a view illustrating a state, in which a low humidity gas is supplied to a gap, in a cross-sectional view of a substrate support unit according to a second embodiment. The substrate support unit according to the second embodiment, a first gap 1273 is formed between a first plate (or an upper plate) formed by the dielectric plate 220 and the electrode plate 230 and an insulator plate 1270 that is a second plate (or a lower plate) provided under the electrode plate 230. The first gap 1273 is defined by a step formed on an upper surface of the insulator plate 1270. An upper end of a supply pipe 1280 is located in the first gap 1273, and the supply pipe 1280 supplies the low humidity gas to the first gap 1273. One or more holes are formed on a side surface of the supply pipe 1280, which is exposed to the interior space 255, and may supply the low humidity gas to the interior space 255.

Figure 7:
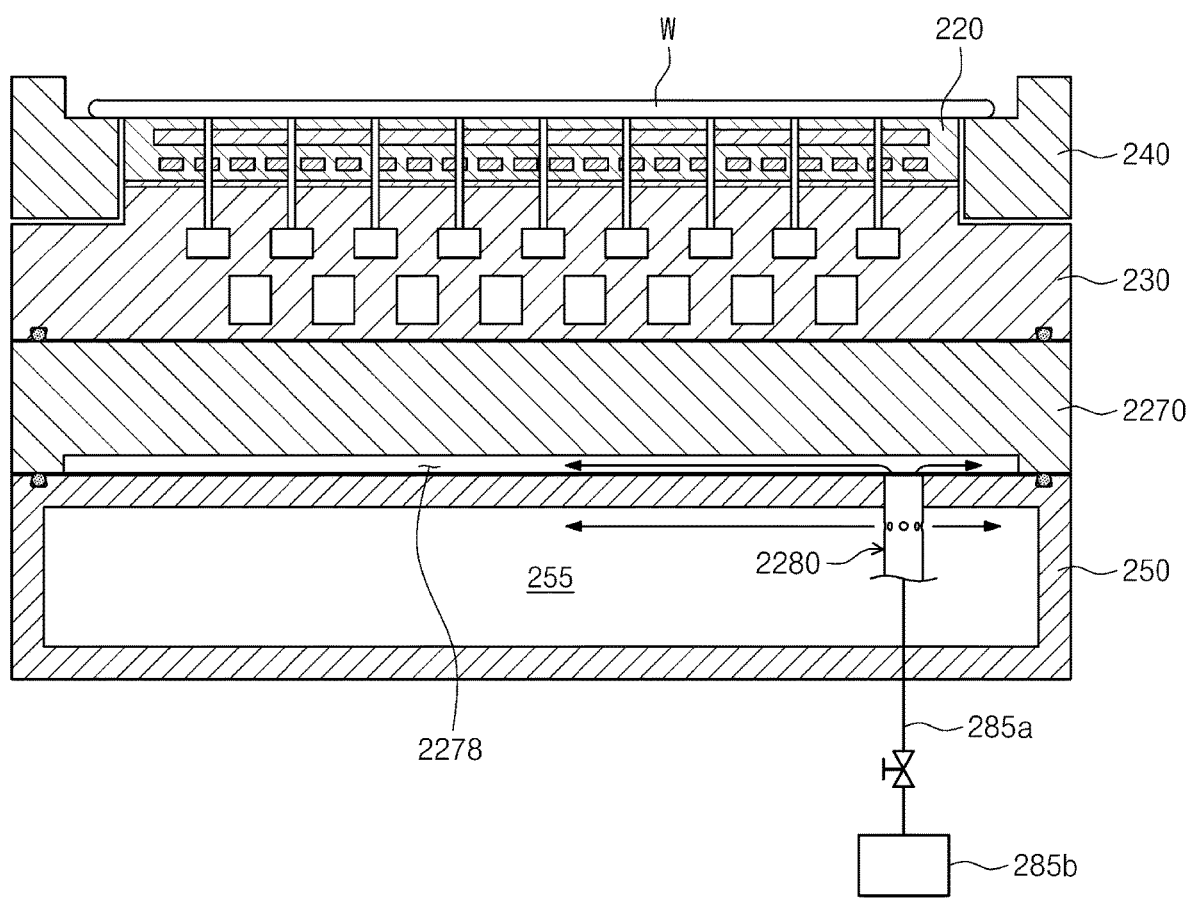
FIG. 7 is a view illustrating a state, in which a low humidity gas is supplied to a gap, in a cross-sectional view of a substrate support unit according to a third embodiment.

FIG. 7 is a view illustrating a state, in which a low humidity gas is supplied to a gap, in a cross-sectional view of a substrate support unit according to a third embodiment. The substrate support unit according to the third embodiment is provided with an electrostatic chuck formed by the dielectric plate 220 and the electrode plate 230, and is provided with an insulator plate 2270 that is a first plate (or an upper plate) provided under the electrode plate 230. The base plate 250 that is a second plate (or a lower plate) is provided under the insulator plate 2270. A second gap 2278 is formed between the insulator plate 2270 and the base plate 250. The second gap 2278 is defined by a step formed on a lower surface of the insulator plate 1270. An upper end of a supply pipe 2280 is located in the second gap 2278, and the supply pipe 1280 supplies the low humidity gas to the second gap 2278. One or more holes are formed on a side surface of the supply pipe 2280, which is exposed to the interior space 255, and may supply the low humidity gas to the interior space 255.

Figure 8:
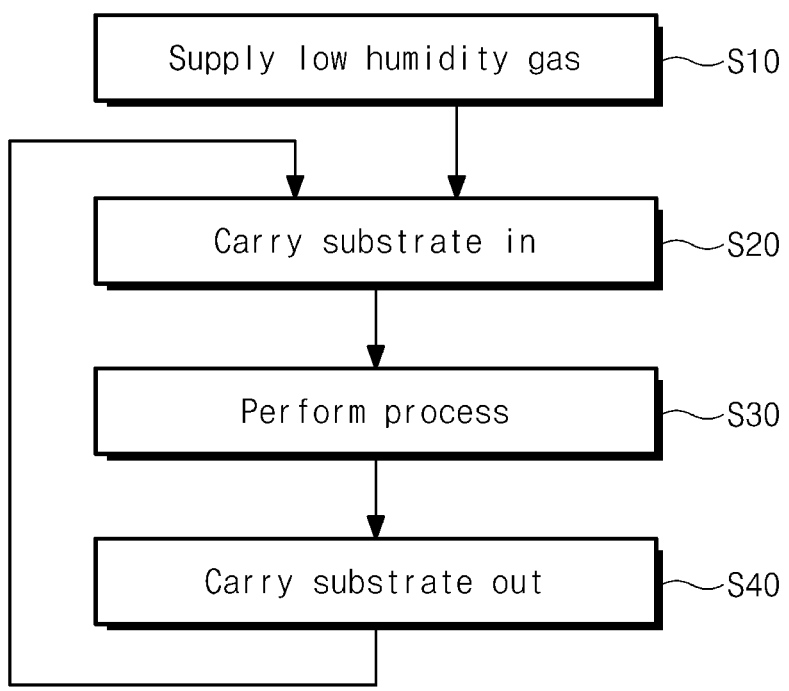
FIG. 8 is a flowchart illustrating a method for operating an apparatus according to an embodiment of the inventive concept.

FIG. 8 is a flowchart illustrating a method for operating an apparatus according to an embodiment of the inventive concept. According to the embodiment of the inventive concept, an internal atmosphere of the treatment space 101 is prepared to perform an extremely low temperature process. In preparing the internal atmosphere, the substrate support unit 200 is controlled to an extremely low temperature by supplying a coolant to the second circulation passage 232 of the substrate support unit 200. The low humidity gas is supplied through the supply pipe 280 that controls the substrate support unit 200 to the extremely low temperature (S10). Thereafter, the substrate W is carried into the interior of the treatment space 101 (S20), and the process is performed in a state, in which the temperature of the substrate W is controlled to the extremely low temperature (S30). The substrate W, on which the process has been completely performed, is carried out from the treatment space 101 of the chamber 100 (S40). Among all the treatment processes, the supply of the low humidity gas is performed continuously.

Although it has been described as a representative example in the above embodiments that the step forming the gap is formed in the insulator plate, the step forming the gap may be formed in the electrode plate or the base plate.

Although it has been described as a representative example in the above embodiments that the step forming the gap is formed only in the insulator plate, may be formed in both of the electrode plate and the base plate.

In the above embodiments, the gap may be a gap caused by machining tolerances during assembling. Meanwhile, the gap formed by the step is defined as a gap that is made to have a distance that is a machining tolerance or more through artificial forming thereof. When the gap of the machining tolerance or more is formed artificially, the coolant may communicate more smoothly, and an additional insulation effect may be obtained by the gap.

Although not illustrated, a plurality of supply pipes may be provided. With the plurality of supply pipes, the low humidity gas may be advantageously replaced more rapidly. However, because the configuration related to the supply units becomes more complex as the number of the supply pipes becomes larger, the number of the supply pipes may be properly adjusted according to designs.

According to the inventive concept, the low humidity gas may be supplied and filled in several gaps caused due to assembling even only with one supply pipe.

As in the embodiment of the inventive concept, when the groove formed by the step is formed, the low humidity gas may be filled in the groove with a constant pressure, and thus the gas may flow and communicate uniformly and smoothly, whereby dew-condensation may be effectively prevented.

In the embodiment, the controller may secure the safety of the facility by controlling such that an interlock is generated when the amount of the low humidity gas deviates from a control range.

The substrate support unit according to the inventive concept may be applied to not only to inductively coupled plasma apparatus but also other plasma treating apparatuses. The other plasma treating apparatuses include a capacitively coupled plasma (CCP) apparatus, a plasma treating apparatus using a radial line slot antenna, a helicon wave plasma (HWP) apparatus, and an electron cyclotron resonance (ECR) plasma apparatus.

Furthermore, the substrate treated by the substrate treating apparatus according to the inventive concept is not limited to a wafer, and for example, may be a large-scale substrate for a flat panel display, an EL element, or a substrate for a solar cell.

An etching process has been described as an embodiment, the inventive concept may be applied to a substrate treating apparatus that performs a deposition process.

According to various embodiments of the inventive concept, dew-condensation components of the substrate support unit, which are exposed to the atmosphere, may be effectively prevented.

According to various embodiments of the inventive concept, dew-condensation components of the substrate support unit, which are exposed to the atmosphere, may be prevented with a relatively simple configuration.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising: a process chamber configured to form a treatment space; a gas supply unit configured to supply a process gas into an interior of the process chamber; a plasma generating unit configured to generate plasma from the process gas introduced into the interior of the process chamber; a substrate support unit provided in the treatment space and configured to support a substrate, wherein the substrate support unit includes: a first plate; a second plate that is adjacent to the first plate, wherein a first gap is formed between the first plate and the second plate; a supply pipe configured to supply a gas into a space defined by the first gap, wherein the supply pipe penetrates the second plate and an upper end of the supply pipe is exposed to the first gap; and a base plate located under the second plate and having an interior space where a lifting module that moves the substrate to the substrate support unit is located, wherein a second gap is formed between a lower surface of the second plate and an upper surface of the base plate, wherein the supply pipe includes: a side surface having a first partial area that is exposed to the second gap and a second partial area that is exposed to the interior space; an inner space surrounded by the side surface; at least one first distribution hole formed at the upper end of the supply pipe; at least one second distribution hole formed at the first partial area of the side surface of the supply pipe; and at least one third distribution hole formed at the second partial area of the side surface of the supply pipe, wherein the inner space connects the at least one first distribution hole, at least one second distribution hole and at least one third distribution hole, and wherein the first plate includes: a dielectric plate in which an electrostatic electrode is embedded and is configured to suction the supported substrate with an electrostatic force; and an electrode plate provided under the dielectric plate and configured to receive electric power for generating the plasma; a supply passage connected to a heat transfer medium storage and passing through the dielectric plate so that an upper end of the supply passage is exposed at an upper surface of the dielectric plate; a first circulation passage disposed in the electrode plate and connected to the supply passage, wherein the supply passage is connected to the heat transfer medium storage via the first circulation passage; and a second circulation passage disposed in the electrode plate and circulating a coolant, wherein the gas is dry air or an inert gas which has lower humidity than an air in a clean room where the substrate treating apparatus is installed, wherein a heat transfer medium supplied from the heat transfer medium storage is supplied toward a bottom surface of the supported substrate via the supply passage, wherein the supply pipe penetrates an upper wall of the base plate and the second gap, wherein the at least one second distribution hole is fluidly connected to the second gap, and the at least one third distribution hole is fluidly connected to the interior space, and wherein the supply pipe further supplies the gas to the second gap and the interior space.

2. The substrate treating apparatus of claim 1, wherein the second plate is an insulator plate provided under the first plate.

3. The substrate treating apparatus of claim 2, wherein the first gap is formed between an upper surface of the insulator plate and a lower surface of the electrode plate.

4. The substrate treating apparatus of claim 3, wherein the first gap is defined by a first recess formed at the upper surface of the insulator plate, and wherein a maximum width of the first recess is the same as or larger than a diameter of an upper surface of the substrate support unit when the first recess is viewed from above.

5. The substrate treating apparatus of claim 4, wherein the second gap is defined by a second recess formed at the lower surface of the insulator plate.

6. The substrate treating apparatus of claim 1, wherein the substrate treating apparatus treats the substrate by using extremely low temperature plasma.

7. A substrate support unit for supporting a substrate, the substrate support unit comprising: an upper plate; a lower plate provided under the upper plate; a base plate located under the lower plate and having an interior space where a lifting module that moves the substrate to the substrate support unit is located, wherein the upper plate includes: a dielectric plate in which an electrostatic electrode is embedded and is configured to suction the supported substrate with an electrostatic force; and an electrode plate provided under the dielectric plate and configured to receive electric power for generating a plasma, and wherein the lower plate is an insulator plate, wherein a first gap is formed between an upper surface of the insulator plate and a lower surface of the electrode plate, wherein a second gap is formed between a lower surface of the insulator plate and an upper surface of the base plate, wherein the substrate support unit further includes a supply pipe configured to supply a gas into the interior space and spaces formed by the first and second gaps while passing through the lower plate and the second gap, and wherein the supply pipe includes: an upper end exposed to the first gap; a side surface having a first partial area that is exposed to the second gap and a second partial area that is exposed to the interior space; an inner space surrounded by the side surface; at least one first distribution hole formed at the upper end of the supply pipe; at least one second distribution hole formed at the first partial area of the side surface of the supply pipe; and at least one third distribution hole formed at the second partial area of the side surface of the supply pipe, wherein the inner space connects the at least one first distribution hole, at least one second distribution hole and at least one third distribution hole; a supply passage connected to a heat transfer medium storage and passing through the dielectric plate so that an upper end of the supply passage is exposed at an upper surface of the dielectric plate; a first circulation passage disposed in the electrode plate and connected to the supply passage, wherein the supply passage is connected to the heat transfer medium storage via the first circulation passage; and a second circulation passage disposed in the electrode plate and circulating a coolant, wherein the supply pipe penetrates an upper wall of the base plate and the second gap, wherein the at least one second distribution hole is fluidly connected to the second gap, and the at least one third distribution hole is fluidly connected to the interior space, and wherein the supply pipe further supplies the gas to the second gap and the interior space.

8. The substrate support unit of claim 7, wherein the first gap is defined by a first recess formed at the upper surface of the insulator plate.

9. The substrate support unit of claim 8, wherein the second gap is defined by a second recess formed at the lower surface of the insulator plate.

10. A substrate treating apparatus for treating a substrate by using plasma, the apparatus comprising: a process chamber configured to form a treatment space; a gas supply unit configured to supply a process gas into an interior of the process chamber; a plasma generating unit configured to generate plasma from the process gas introduced into the interior of the process chamber; and a substrate support unit provided in the treatment space and configured to support the substrate, wherein the substrate support unit includes: a dielectric plate in which an electrostatic electrode is embedded and is configured to suction the substrate; an electrode plate provided under the dielectric plate; an annular focus ring provided at a circumference of the dielectric plate; an insulator plate provided under the electrode plate and formed of an insulator; a base plate provided under the insulator plate and grounded, wherein the base plate has an interior space where a lifting module that moves the substrate to the substrate support unit is located; a first gap formed between the electrode plate and the insulator plate; a second gap formed between the insulator plate and the base plate; a supply pipe connecting the first gap to the second gap and configured to supply a dry air or an inert gas to the first and second gaps, wherein the dry air or the inert gas has lower humidity than an air in a clean room where the substrate treating apparatus is installed; a supply passage connected to a heat transfer medium storage and passing through the dielectric plate so that an upper end of the supply passage is exposed at an upper surface of the dielectric plate; a first circulation passage disposed in the electrode plate and connected to the supply passage, wherein the supply passage is connected to the heat transfer medium storage via the first circulation passage; and a second circulation passage disposed in the electrode plate and circulating a coolant, wherein the supply pipe includes: an upper end exposed to the first gap; a side surface having a first partial area that is exposed to the second gap and a second partial area that is exposed to the interior space; an inner space surrounded by the side surface; at least one first distribution hole formed at the upper end of the supply pipe; at least one second distribution hole formed at the partial area of the side surface of the supply pipe; and at least one third distribution hole formed at the second partial area of the side surface of the supply pipe, wherein the inner space connects the at least one first distribution hole, at least one second distribution hole and at least one third distribution hole, wherein a heat transfer medium supplied from the heat transfer medium storage is supplied toward a bottom surface of the supported substrate via the supply passage, wherein the supply pipe penetrates an upper wall of the base plate and the second gap, wherein the at least one second distribution hole is fluidly connected to the second gap, and the at least one third distribution hole is fluidly connected to the interior space, and wherein the supply pipe further supplies the dry air or the inert gas to the second gap and the interior space.

11. The substrate treating apparatus of claim 10, wherein the first gap and the second gap are connected with each other via the at least one first distribution hole and the at least one second distribution hole of the supply pipe.

* * * * *